US009673066B2

(12) United States Patent
Park et al.

(10) Patent No.: US 9,673,066 B2
(45) Date of Patent: Jun. 6, 2017

(54) APPARATUS AND METHOD OF MANUFACTURING SEMICONDUCTOR PACKAGE MODULE

(71) Applicant: SAMSUNG ELECTRO-MECHANICS CO., LTD., Suwon-si (KR)

(72) Inventors: No Il Park, Suwon-si (KR); Seung Wook Park, Suwon-si (KR); Eung Suek Lee, Suwon-si (KR); Tae Sung Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/987,490

(22) Filed: Jan. 4, 2016

(65) Prior Publication Data
US 2017/0004980 A1 Jan. 5, 2017

(30) Foreign Application Priority Data

Jun. 30, 2015 (KR) ........................ 10-2015-0092903

(51) Int. Cl.
*H01L 21/56* (2006.01)
*H01L 21/67* (2006.01)
*H01L 25/00* (2006.01)
*H01L 25/065* (2006.01)
*H01L 23/31* (2006.01)

(52) U.S. Cl.
CPC ...... *H01L 21/565* (2013.01); *H01L 21/67126* (2013.01); *H01L 23/3142* (2013.01); *H01L 25/0655* (2013.01); *H01L 25/50* (2013.01)

(58) Field of Classification Search
CPC .......................... H01L 21/565; H01L 21/566
See application file for complete search history.

(56) References Cited

U.S. PATENT DOCUMENTS

| | | | | |
|---|---|---|---|---|
| 6,270,712 B1* | 8/2001 | Shoji | ..................... | B29C 33/424 249/103 |
| 7,153,116 B2* | 12/2006 | Tofukuji | ................. | B29C 43/36 425/116 |
| 7,604,469 B2* | 10/2009 | Chang | ..................... | B29C 45/73 425/127 |
| 2006/0166381 A1* | 7/2006 | Lange | ................... | H01L 21/565 438/14 |
| 2009/0079052 A1* | 3/2009 | Youn | ..................... | H01L 21/566 257/678 |

FOREIGN PATENT DOCUMENTS

| | | |
|---|---|---|
| KR | 10-2009-0070649 A | 7/2009 |
| KR | 10-2015-0004715 A | 1/2015 |
| KR | 10-2015-0012769 A | 2/2015 |

* cited by examiner

*Primary Examiner* — Robert B Davis
(74) *Attorney, Agent, or Firm* — NSIP Law

(57) ABSTRACT

An apparatus for manufacturing a semiconductor package module and a method of manufacturing a semiconductor package are provided. The apparatus for manufacturing a semiconductor package module includes a lower mold installed thereon with a board with at least one element mounted thereon, an upper mold, in a state of accommodating the board, provided above the board, a filler supplier disposed in at least one of the upper mold and the lower mold, and supplying a filler to a molding space between the board and the upper mold, and a pattern forming member provided in an inner surface of the upper mold that provides an uneven pattern on a molded part.

10 Claims, 6 Drawing Sheets

APPARATUS AND METHOD OF MANUFACTURING SEMICONDUCTOR PACKAGE MODULE

CROSS-REFERENCE TO RELATED APPLICATION

This application claims the benefit under 35 USC 119(a) of Korean Patent Application No. 10-2015-0092903, filed on Jun. 30, 2015, in the Korean Intellectual Property Office, the entire disclosure of which is incorporated herein by reference for all purposes.

BACKGROUND

1. Field

The following description relates to an apparatus and method of manufacturing a semiconductor package module, and to a technique of forming a molded part on a board.

2. Description of Related Art

A semiconductor package module may have a structure in which one or more elements are mounted on a board. The board and the elements are covered by an insulating layer, and the insulating layer may be a resin layer containing a mixture of epoxy and a filler.

In order to protect the elements, a molded part is formed to cover the elements.

After the formation of the molded part, a top package is formed by forming a wiring layer (a Cu layer or the like) of a circuit and mounting elements thereon above the bottom package in order to complete the manufacturing process of a bottom package.

During the formation of the top package, the wiring layer needs to be coupled to an outer surface of the molded part. However, the process is complicated by the fact that the outer surface of the molded part does not have surface roughness sufficient for the wiring layer to be coupled thereto.

Thus, an apparatus and method of manufacturing a semiconductor package module addressing the manufacturing issues is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for manufacturing a semiconductor package module includes a lower mold installed with a board having at least one element mounted thereon, an upper mold disposed above the board in a state of accommodating the board, a filler supplier disposed in at least one of the upper mold and the lower mold, the filler supplier supplying a filler to a molding space between the board and the upper mold, and a pattern forming member provided in an inner surface of the upper mold that provides an uneven pattern on a molded part.

The pattern forming member may include an uneven mold pattern provided integrally with the upper mold.

The pattern forming member may include a coupling sheet having the uneven mold pattern and attached to the inner surface of the upper mold facing the board, the coupling sheet being coupled to the molded part during curing of the filler.

The pattern forming member may include an uneven sheet having an uneven pattern and attached to the inner surface of the upper mold facing the board.

The uneven sheet may be provided to be separated from the molded part after curing the filler.

The pattern forming member may include a main uneven pattern, and a sub-uneven pattern smaller than the main uneven pattern and disposed in the main uneven pattern.

The pattern forming member may form the uneven pattern in such a manner that a cross-section thereof has a circular, oval, triangular, or quadrangular shape with respect to a plane perpendicular to the upper or lower mold.

The pattern forming member may form the uneven pattern in such a manner that a cross-section thereof has a solid U shape, a solid V shape, or a needle shape with respect to the plane horizontal to the upper or lower mold.

In another general aspect, a method of manufacturing a semiconductor package module involves supplying a filler to a board on which at least one element is mounted, and curing the filler to produce a molded part, and an uneven pattern is provided, while the filler is being cured, in such a manner that surface roughness is formed on an outer surface of the molded part.

The general aspect of the method may further involve preparing a mold for the molded part by installing on a lower mold the board with at least one element mounted thereon, and positioning an upper mold with the uneven pattern provided on an inner surface thereof to an upper side of the board, and the supplying of the filler may involve supplying the filler to a molding space between the board and the upper mold to shape the molded part.

In another general aspect, a method of manufacturing a semiconductor package module involves preparing a mold by disposing a board and an element in a molding space of the mold, the mold including a pattern forming member, filling the molding space with a filler, and curing the filler to obtain a molded part, the molded part having an outer surface having a pattern corresponding to the pattern forming member and embeds the element in an insulating material obtained by curing the filler.

The preparing of the mold may involve installing on a lower mold the board having the element mounted thereon and positioning an upper mold having the pattern forming member above the lower mold.

In another general aspect, an apparatus for manufacturing a semiconductor package module includes a lower mold having an installation area to mount a board with an element mounted thereon, an upper mold having a pattern forming member, the upper mold being provided above the lower mold to form a molding space between the board and the pattern forming member during molding, and an inlet provided in at least one of the lower mold or the upper mold, the inlet supplying a filler to the molding space during molding.

The pattern forming member may be formed integrally with the upper mold.

The pattern forming member may be provided as a release sheet attached to a surface of the lower mold facing the board.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
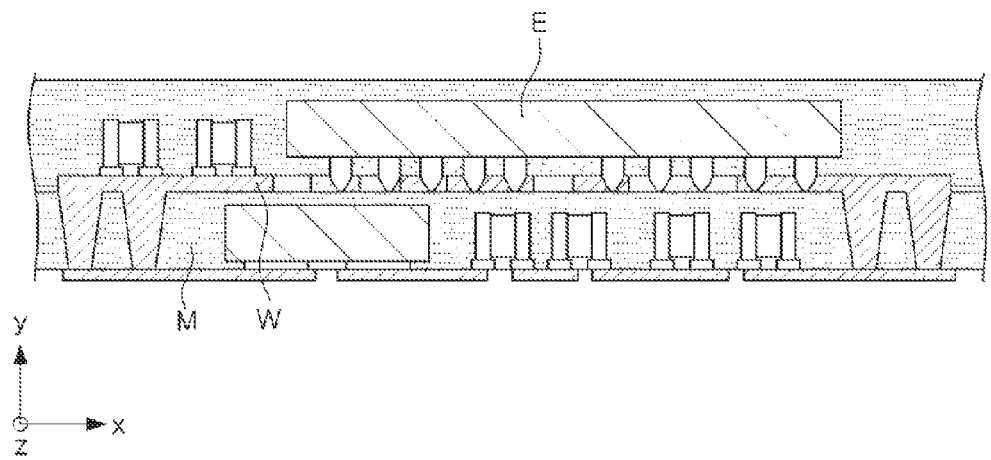
FIG. 1 is a frontal sectional view illustrating an example of a semiconductor package module according to the present description.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

An embodiment of the present description relates to a technique of forming a molded part M on a board B.

Another embodiment of an apparatus and/or method of manufacturing a semiconductor package module is directed to a formation of a pattern for increasing surface roughness of a molded part M. According an embodiment of the apparatus and/or method of manufacturing a semiconductor package module, adhesion may be enhanced when a wiring W of a wiring layer is formed on the molded part M, thus reducing a defect rate of circuit wiring (or circuit lines) W.

For example, surface roughness of the molded part M may be simultaneously formed while the molded part M is formed from a filler by curing. Thus, the surface roughness of the molded part M may be enhanced without performing a separate process to generate the surface roughness.

Figure 2:
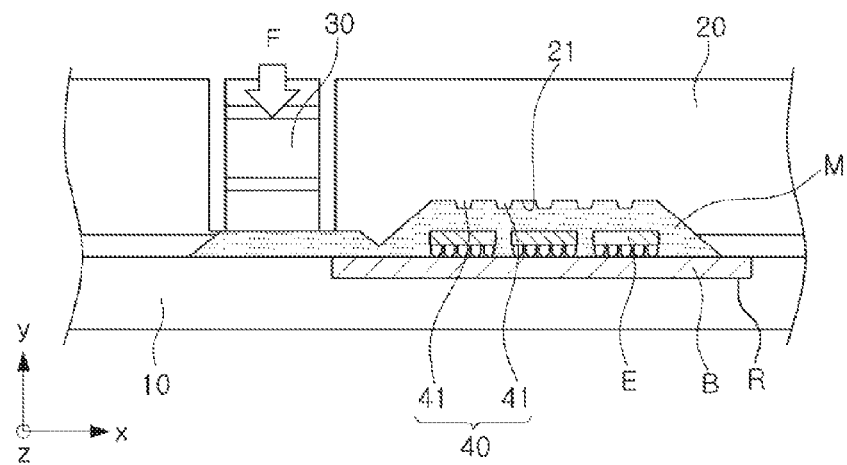
FIG. 2 is a frontal sectional view illustrating an example of an apparatus of manufacturing a semiconductor package module that includes an uneven mold pattern.
Figure 5:
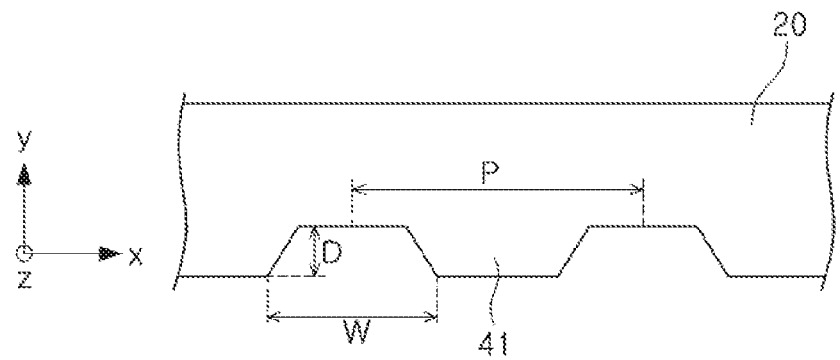
FIG. 5 is a frontal sectional view illustrating an example of an uneven mold part of an apparatus of manufacturing a semiconductor package module according to the present disclosure.

FIG. 1 illustrates an example of a semiconductor package module. FIG. 2 illustrates an example of an apparatus of manufacturing a semiconductor package module that includes an uneven mold pattern 41. FIG. 5 illustrates an example of the uneven mold part 41 according to the apparatus of manufacturing a semiconductor package module illustrated in FIG. 2.

Referring to FIGS. 1, 2, and 5, the example of the apparatus of manufacturing a semiconductor package module includes a lower mold 10 on which a board B with at least one element mounted thereon is installed, an upper mold 20 provided above the board B in a state in which the upper mold 20 accommodates the board B therein, a filler supplier 30 provided in at least one of the upper mold 20 and the lower mold 10 and supplying a filler F in order to form a molded part M between the board B and the upper mold 20, and a pattern forming member 40 provided on an inner surface 21 of the upper mold 20 to provide an uneven pattern.

Also, according to one example, the pattern forming member 40 of the apparatus of manufacturing a semiconductor package module may include an uneven mold pattern 41 integrally formed with the upper mold 20 and having an uneven shape.

That is, because the apparatus of manufacturing a semiconductor package module may enhance roughness of the surface of the molded part M through the uneven pattern while the molded part M is being formed by curing a filler, a separate process is not required, increasing efficiency of production.

In other words, because roughness of the surface of the molded part M is enhanced without performing a separate process in manufacturing the semiconductor package module proposed in FIG. 1, a coupling force thereof with the circuit wiring W formed on a surface of the molded part M may be enhanced.

The lower mold 10 may serve to allow the board B with an element E such as an electronic component mounted thereon to be installed thereon when the semiconductor package module is manufactured. Thereafter, the lower mold 10 may cooperate with the upper mold 20 while the molded part M is being formed by the filler supplier 30 by curing a filler.

To this end, in FIG. 2, an installation recess R for allowing the board B to be installed thereon, or the like, is formed on the lower mold 10. However, there are various ways of installing the board on the lower mold 10. For instance, in another example, instead of an installation recess R, a protrusion and the like may be provided on the upper surface of the lower mold 10 to hold the board.

The upper mold 20 may cooperate with the lower mold 10 to form a molding space filled with a filler in order to form the molded part M.

For example, the upper mold 20 may have a pattern forming member 40 (to be described hereinafter) providing an uneven pattern on an inner surface 21 thereof facing the board B, thereby forming an uneven pattern on the surface of the molded part M when the molded part M is formed.

Since a pattern corresponding to the uneven pattern formed on the inner surface 21 of the upper mold 20 is formed on the surface of the molded part M, roughness of the surface of the molded part M may be enhanced.

The filler supplier 30 serves to form the molded part M with respect to the board B by providing a filler F. That is, when a filler F is injected into a molding space between the lower mold 10 in which the board B is installed and the upper mold 20, the filler F is cured to correspond to the shape of the upper mold 20 and the lower mold 10, thus forming the molded part M.

To this end, the filler supplier 30 may be coupled to the upper mold 20 or the lower mold 10. The filler supplier 30 may include an inlet through which the filler F is supplied into the molding space, a heat generating unit that melts the supplied filler F, and a supply hole that supplies the filler F to the molding space between the upper mold 20 and the lower mold 10.

The pattern forming member 40 forms a pattern, or the like, on the surface of the molded part M while the filler is being cured to form the molded part M, thus enhancing roughness of the surface of the molded part M.

That is, a pattern, or the like, is formed on the surface of the molded part M simultaneously while the filler is being cured to form the molded part M, thus enhancing roughness.

Thus, the difficulty in applying a surface roughness enhancement technique to an insulating layer of the board B to enhance roughness of the surface of the molded part M may be solved.

In other words, surface roughness of the molded part M may be enhanced even without using a surface treatment method for increasing surface roughness to strengthen adhesion of the surface of the insulating layer of the board B as described hereinafter.

An existing roughness enhancement technique applied to the surface of the insulating layer of the board B is as follows.

First, in general, there is a desmear technique of spraying a diluted permanganic acid to a semi-cured or completely cured resin layer, performing swelling using a chemical reaction with the resin layer, and subsequently performing reduction, or a plasma surface treatment technique of utilizing a gas reaction.

Also, an ultraviolet (UV) photosensitive film is applied as a resin layer, filter particles such as a silica component, or the like, dispersed in the resin layer are removed from a surface of the resin layer, thus increasing a surface area of the resin layer to enhance surface roughness, and thereafter, adhesion of the resin layer with the circuit wiring W may be increased.

However, when the surface roughness enhancement technique applied to the board B is applied to the surface of the molded part M, portions other than the surface of the molded part M are also contaminated or corroded, causing a limitation in its application, and the technique may increase production cost in that an additional process is required to be performed.

In an example in which the pattern forming member 40 forms a pattern, or the like, to enhance surface roughness of the molded part M, the uneven mold pattern 41 may be formed, an uneven sheet 42 may be provided, or a coupling sheet 43 may be provided.

The example in which the uneven sheet 42 is provided will be described further with reference to FIG. 3, and the example in which the coupling sheet 43 is provided will be described further with reference to FIG. 4.

In this example, the uneven mold pattern 41 is integrally formed with the upper mold 20. That is, in order for the pattern forming member 40 to provide an uneven pattern to the inner surface 21 of the upper mold 20, the uneven mold pattern 41 is integrally formed with the upper mold 20.

In this manner, because the uneven mold pattern 41 is integrally formed on the inner surface 21 of the upper mold 20, when the filler supplier 30 forms the molded part M, the same pattern as that of the uneven molded pattern 41 may be formed on the surface of the molded part M.

Figure 9A:
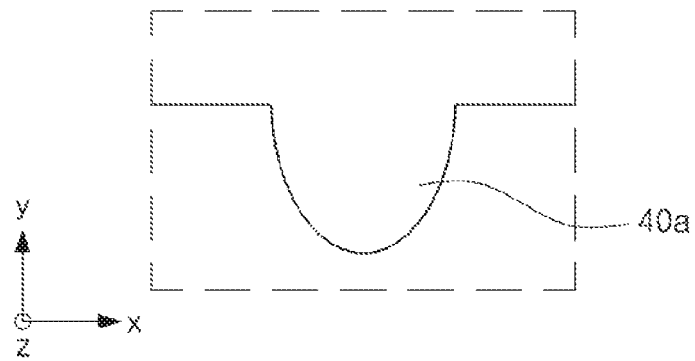
Figure 9B:
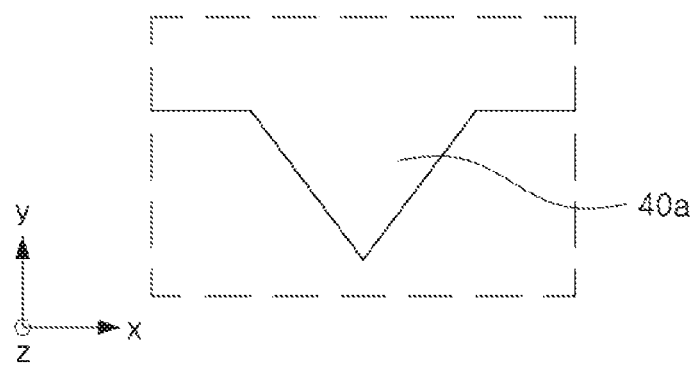
Figure 9C:
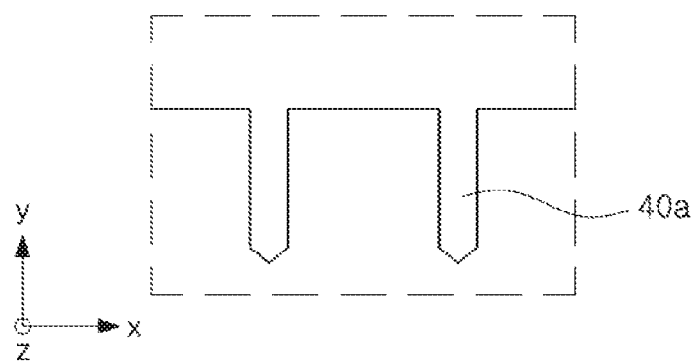

The uneven pattern will be described further with reference to FIGS. 8 and 9.

Figure 3:
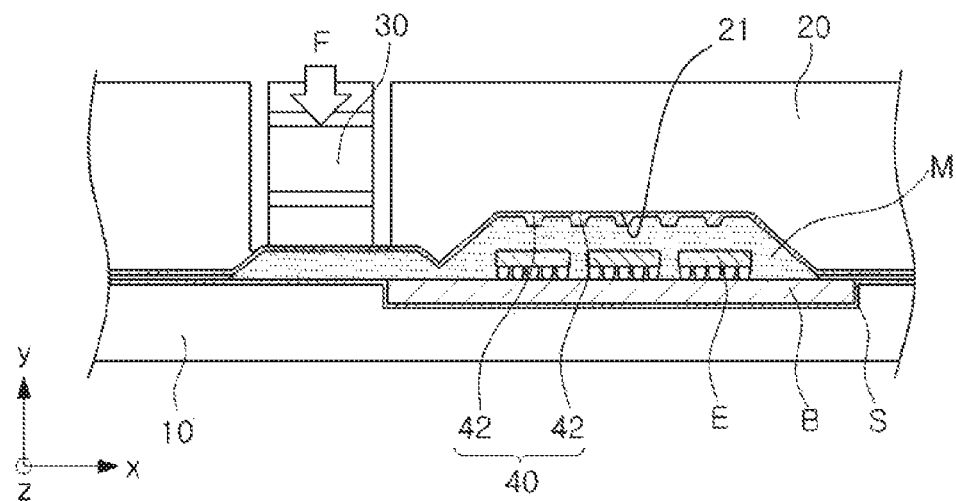
FIG. 3 is a frontal sectional view illustrating an example of an apparatus of manufacturing a semiconductor package module that includes an uneven sheet.

FIG. 3 illustrates an example of an apparatus of manufacturing a semiconductor package module that includes an uneven sheet 42. Referring to FIG. 3, the pattern forming member 40 of the apparatus of manufacturing a semiconductor package module include the uneven sheet 42 tightly attached to the inner surface 21 of the upper mold 20 in one surface thereof, having an uneven pattern formed on the other surface thereof, and facing the board B.

Also, the uneven sheet 42 of the apparatus of manufacturing a semiconductor package module is provided to be separated from the molded part M once the filler F is fully cured to form the molded part M.

That is, as an example in which the pattern forming member 40 provides an uneven pattern on the inner surface 21 of the upper mold 20, the uneven sheet 42 may be provided.

In this example, the uneven sheet 42 is a sheet provided on the inner surface 21 of the upper mold 20 and having an uneven pattern on a surface thereof facing the board B.

To this end, one surface of the uneven sheet 42 is tightly attached to the inner surface 21 of the upper mold 20, and the uneven pattern is formed on the other surface of the uneven sheet 42 to face the board B.

In another example, the uneven sheet 42 may replace a separation sheet or a release sheet (or a release film) provided to facilitate release from the upper mold 20 or the lower mold 10 when a semiconductor package module is manufactured according to the related art.

That is, since the uneven sheet 42 is provided in such a manner that it can be easily separated from the molded part M, separation of the semiconductor package module from the upper mold 20 may be facilitated after the semiconductor package module is manufactured.

The separate separation sheet S or release sheet may also be provided between the lower mold 10 and the board B to facilitate separation of the semiconductor package module from the lower mold 10. According to one example, the separation sheet S or release sheet may be removed from the molded part M or the board B after the molded part M or the board B is removed from the upper mold 20 or the lower mold 10.

Figure 4:
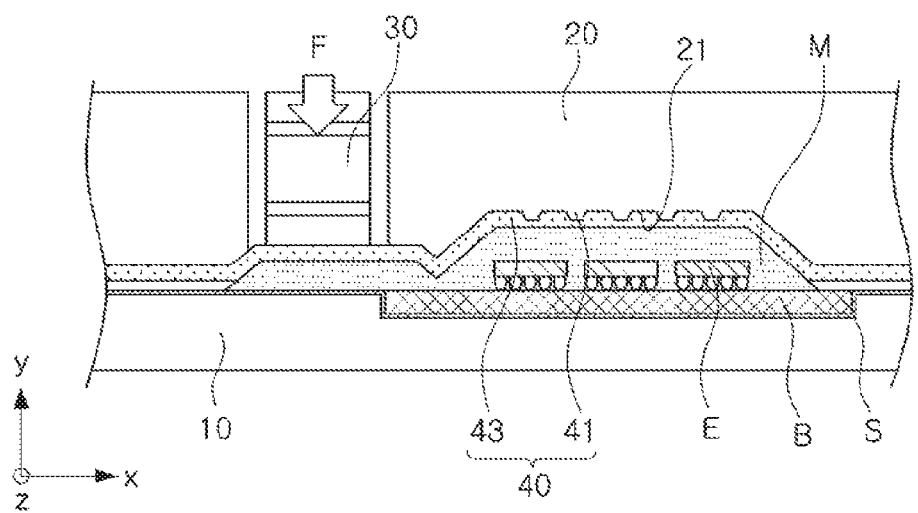
FIG. 4 is a frontal sectional view illustrating an example of an apparatus of manufacturing a semiconductor package module that includes a coupling sheet.

FIG. 4 illustrates an example of an apparatus of manufacturing a semiconductor package module that includes a coupling sheet 43. Referring to FIG. 4, the pattern forming member 40 of the apparatus of manufacturing a semiconductor package module includes the coupling sheet 43 having one surface tightly attached to the inner surface 21 of the upper mold 20 with which the uneven mold pattern 41 is integrated, and the other surface facing the board B, so as to be coupled to the molded part M.

That is, in addition to the uneven mold pattern 41 integrally formed with the upper mold 20, the upper mold 20 may further include the coupling sheet 43.

Unlike the uneven sheet 42 having the uneven pattern so as to be provided, a pattern, or the like, of the coupling sheet 42 is formed by the uneven mold pattern 41.

To this end, one surface of the coupling sheet 43 is tightly attached to the inner surface 21 of the upper mold 20 with which the uneven mold pattern 41 is integrated, and the other surface of the coupling sheet 43 is coupled to the molded part M.

In other words, instead of the molded part M, roughness of the surface of the coupling sheet 43 is enhanced, and a circuit wiring W, or the like, is coupled to the surface of the coupling sheet 43 and provided.

The coupling sheet 43 may be provided in a semi-cured state in such a manner that a pattern of one surface thereof tightly attached to the inner surface 21 of the upper mold 20 may be deformed.

Also, even in a case in which a pattern, or the like, is formed on the molded part M, if it is difficult to form roughness for coupling with the circuit wiring W, the coupling sheet 43 formed of an insulating material may be provided as a primer layer.

In addition, because the coupling sheet 43 may be formed of an insulating material to form an insulating layer of the board B, a desmear technique or a plasma surface treatment technique may be further applied to enhance surface roughness even after the formation of a pattern, or the like, by the upper mold 20.

Figure 6:
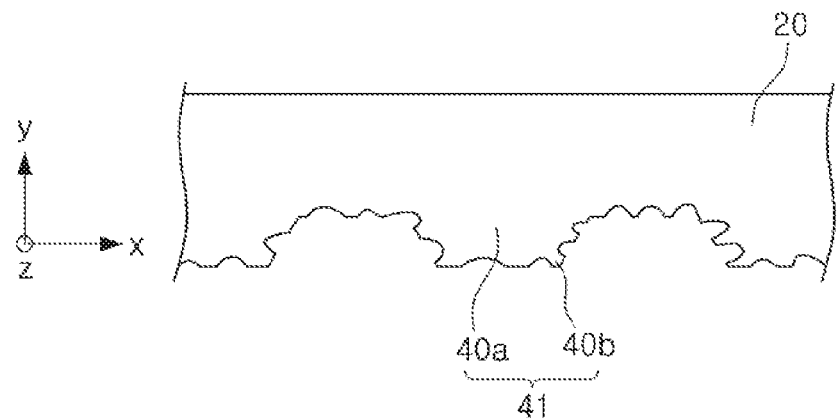
FIGS. 6 and 7 are frontal sectional views illustrating examples of apparatuses of manufacturing semiconductor package modules that include sub-uneven patterns.
Figure 7:
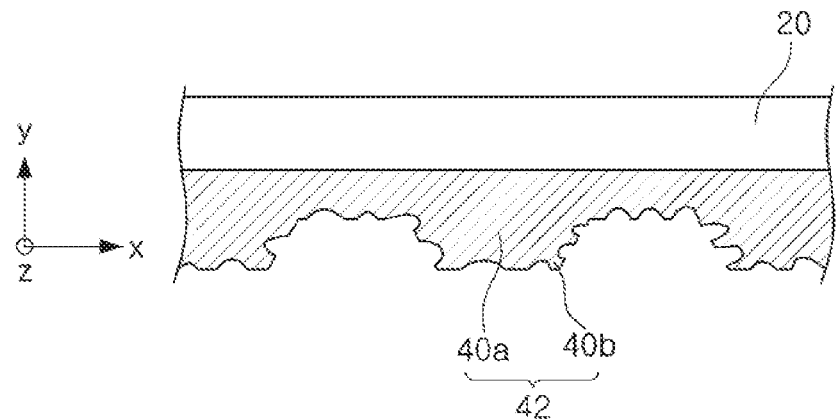
Figure 8A:
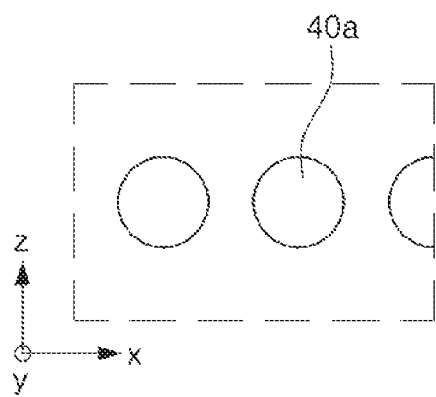
FIGS. 8A to 8D and 9A to 9C are plan views and sectional views illustrating examples of uneven patterns.
Figure 8B:
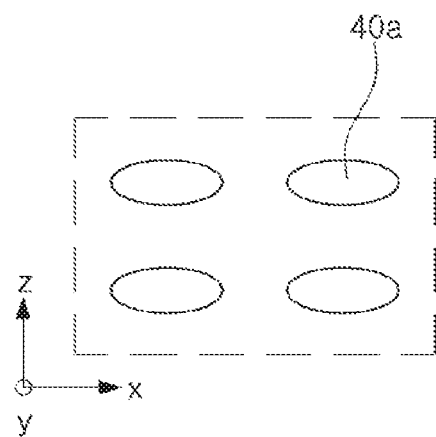
Figure 8C:
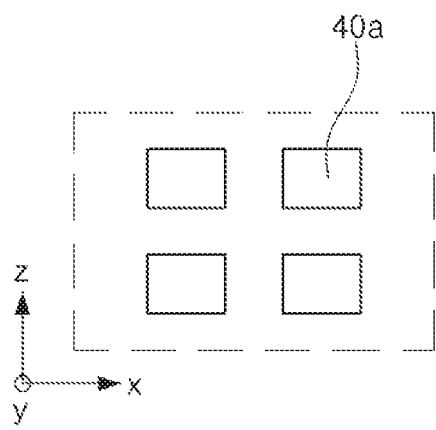
Figure 8D:
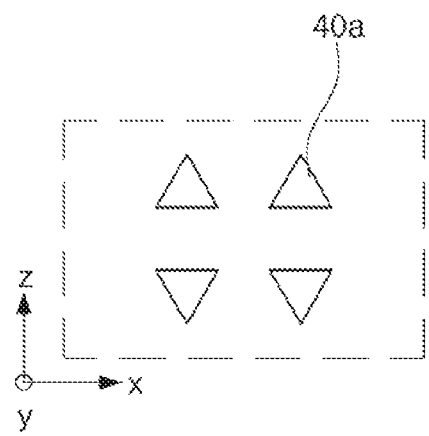

FIGS. 6 and 7 illustrate examples of apparatuses of manufacturing a semiconductor package module that include sub-uneven patterns 40b. FIG. 6 illustrates an example of a sub-uneven pattern 40b formed in the uneven mold pattern 41, and FIG. 7 illustrates an example of a sub-uneven pattern 40b that is formed in the uneven sheet 42.

Referring to FIGS. 6 and 7, the pattern forming member 40 of the apparatus of manufacturing a semiconductor package module includes a main uneven pattern 40a as an uneven pattern and a sub-uneven pattern 40b smaller than the main uneven pattern 40a and formed in the main uneven pattern.

In other words, the main uneven pattern 40a is provided as a pattern in the inner surface 21 of the upper mold 20, and in addition, the sub-uneven pattern 40b is provided in the main uneven pattern 40a, whereby a contact area may be increased when the circuit wiring W is formed thereafter.

In this example, since surface roughness of the molded part M is further enhanced, adhesion with the circuit wiring W may be further increased.

To this end, the sub-uneven pattern 40b is formed to be smaller than the main uneven pattern 40a. Thus, the number of the sub-uneven patterns 40b is greater than that of the main uneven patterns.

FIGS. 8A to 8D and 9A to 9C illustrate plan views and cross-sectional views of examples of uneven patterns.

Referring to FIGS. 8A to 8D and 9A to 9C, the pattern forming member 40 provides a specific uneven pattern. That is, the pattern forming member 40 specifies a pattern to be formed on the molded part M and provides the specified pattern as a pattern for enhancing surface roughness of the molded part M.

For example, the pattern forming member 40 of the apparatus of manufacturing a semiconductor package module may form an uneven pattern in such a manner that a cross-section thereof has a circular shape, an oval shape, a triangular shape, or a quadrangular shape with respect to a plane horizontal to the upper mold 20 or the lower mold 10.

Also, the pattern forming member 40 of the apparatus of manufacturing a semiconductor package module may form an uneven pattern in such a manner that a cross-section thereof has a solid U shape, a solid V shape, or a needle shape with respect to the plane perpendicular to the upper mold 20 or the lower mold 20. In sum, the pattern forming member may have protrusions having a dome shape, a cone shape, a pyramid shape, a needle shape and the like.

Also, referring further to FIG. 5, a depth D, a width W, and a pitch P may be set in specifying the uneven pattern in order to enhance surface roughness of the molded part M.

The depth D and the width W of the uneven pattern may be set to 0.1 μm to 100 μm, and the pitch P between neighboring uneven patterns may be set to 0.2 μm to 200 μm.

In addition, the present disclosure also proposes an example of a method of manufacturing a semiconductor package module.

Figure 10A:
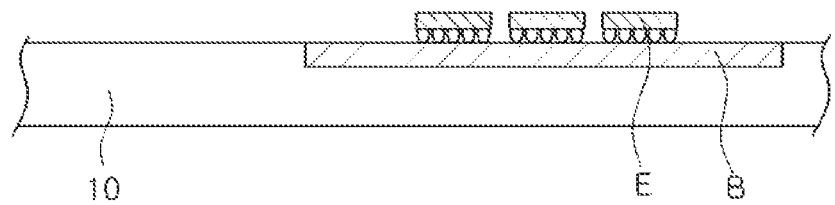
FIGS. 10A through 10C are frontal sectional views illustrating an example of a method of manufacturing a semiconductor package module.

FIGS. 10A through 10O illustrate an example of a method of manufacturing a semiconductor package module. Referring to FIGS. 10A through 10O, according to an example of a method of manufacturing a semiconductor package module, a filler F is supplied to a surface of a board B on which at least one element E is mounted, and the filler is cured to form a molded part M. An uneven pattern is formed in the curing filler to enhance surface roughness of an outer surface of the molded part M while the molded part M is being cured.

Features of the illustrated example of the method of manufacturing a semiconductor package module that is the same as that of the examples of the apparatuses of manufacturing a semiconductor package module described above have been omitted for conciseness of the description. Through the illustrated method, an uneven pattern is formed on an upper surface of the molded part M in order to enhance surface roughness of the outer surface of the molded part M while the molded part M is being cured.

In addition, the example of the method of manufacturing a semiconductor package module may further include a preparation operation, an operation of moving the upper mold 20, and a molding operation.

The preparation operation refers to an operation in which the board B is installed on the lower mold 10 and to prepare the molded part M to be molded prior to the filler being disposed for molding. FIG. 10A illustrates a lower mold 10 mounted with a board B on which a plurality of elements at disposed.

Figure 10B:
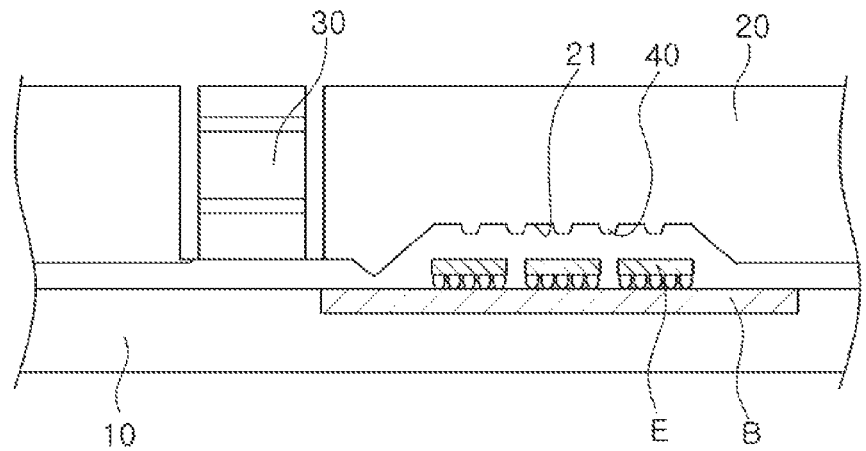
Figure 10C:
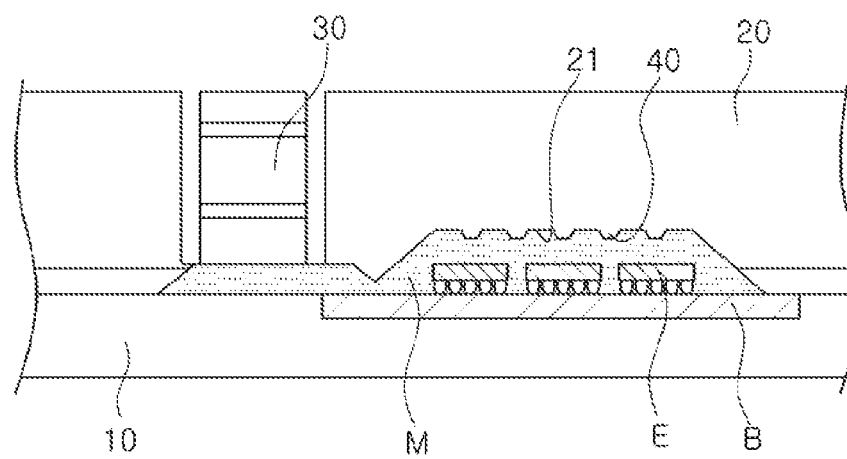

The operation of moving the upper mold 20 refers to an operation of moving the upper mold 20 to the board B installed on the lower mold 10 and forming a mold before disposing the filler by the filler supplier 30. FIG. 10B illustrates the placement of the upper mold 20 over the board B installed on the lower mold 10 to form a mold.

In this example, because the aforementioned uneven pattern is formed on the inner surface 21 of the upper mold 20, when the molded part M is formed by the filler supplier 30, a pattern or the like may be formed to enhance roughness of the surface of the molded part M.

After the operation of moving the upper mold 20, a filler F is supplied to a molding space between the upper mold 20 and the lower mold 10 by the filler supplier 30 to form the molded part M. FIG. 10O illustrates the filling of the molding space with a filler F.

In this example, the molded part M has a pattern that corresponds to the uneven pattern formed on the inner surface 21 of the upper mold 20.

In this manner, the example of the method of manufacturing a semiconductor package module includes the preparation operation of installing the board B with at least one element E mounted thereon on the lower mold 10, the upper mold moving operation of moving the upper mold 20 having the inner surface 21 with an uneven pattern to an upper side of the board B, and the molding operation of forming the molded part M by supplying the filler F between the board B and the upper mold 20.

As set forth above, the apparatus and method of manufacturing a semiconductor package module described above may form a pattern for increasing surface roughness of the molded part.

Also, because adhesion of the molded part is increased in forming a wiring of a wiring layer, a defect rate of a circuit wiring may be reduced.

In addition, because surface roughness of the molded part is formed simultaneously while the molded part is being formed, surface roughness of the molded part may be enhanced even without additionally performing a pattern forming process.

Thus, productivity of the manufacturing method for semiconductor package module may be enhanced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for manufacturing a semiconductor package module, the apparatus comprising:
   a lower mold installed with a board having an element mounted thereon;
   an upper mold disposed above the board to accommodate the board;
   a filler supplier disposed in at least one of the upper mold and the lower mold, the filler supplier supplying a filler to a molding space between the board and the upper mold; and
   a pattern forming member provided in an inner surface of the upper mold that provides an uneven pattern on a molded part,
   wherein the pattern forming member comprises:
      a main uneven pattern; and
      a sub-uneven pattern smaller than the main uneven pattern and disposed in the main uneven pattern.

2. The apparatus of claim 1, wherein the pattern forming member comprises an uneven mold pattern formed integrally with the upper mold.

3. The apparatus of claim 2, wherein the pattern forming member comprises a coupling sheet having the uneven mold pattern and attached to the inner surface of the upper mold facing the board, the coupling sheet contacting the filler during curing of the filler to form the molded part.

4. The apparatus of claim 1, wherein the pattern forming member comprises an uneven sheet having an uneven pattern and attached to the inner surface of the upper mold facing the board.

5. The apparatus of claim 4, wherein the uneven sheet separates from the molded part after curing the filler.

6. The apparatus of claim 1, wherein the pattern forming member forms the uneven pattern in such a manner that a cross-section thereof has a circular, oval, triangular, or quadrangular shape with respect to a plane perpendicular to the upper or lower mold.

7. The apparatus of claim 1, wherein the pattern forming member forms the uneven pattern in such a manner that a cross-section thereof has a solid U shape, a solid V shape, or a needle shape with respect to the plane horizontal to the upper or lower mold.

8. An apparatus for manufacturing a semiconductor package module, the apparatus comprising:
   a lower mold having an installation area to position a board having an element mounted thereon;
   an upper mold having a pattern forming member, the upper mold being provided above the lower mold to form a molding space between the board and the pattern forming member during molding; and
   an inlet provided in at least one of the lower mold or the upper mold, the inlet supplying a filler to the molding space during molding,
   wherein the pattern forming member comprises:
      a main uneven pattern; and
      a sub-uneven pattern smaller than the main uneven pattern and disposed in the main uneven pattern.

9. The apparatus of claim 8, wherein the pattern forming member is formed integrally with the upper mold.

10. The apparatus of claim 8, wherein the pattern forming member is provided as a release sheet attached to a surface of the lower mold facing the board.

* * * * *